(12) United States Patent
Jung

(10) Patent No.: US 9,118,312 B2
(45) Date of Patent: Aug. 25, 2015

(54) ON-DIE TERMINATION CIRCUIT

(71) Applicant: SK hynix Inc., Icheon-si Gyeonggi-do (KR)

(72) Inventor: Jong Ho Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 296 days.

(21) Appl. No.: 13/710,834

(22) Filed: Dec. 11, 2012

(65) Prior Publication Data
US 2014/0002129 A1    Jan. 2, 2014

(30) Foreign Application Priority Data

Jun. 27, 2012  (KR) .................. 10-2012-0069155

(51) Int. Cl.
*H03K 19/00* (2006.01)
(52) U.S. Cl.
CPC .................. *H03K 19/0005* (2013.01)
(58) Field of Classification Search
None
See application file for complete search history.

(56) References Cited

U.S. PATENT DOCUMENTS

| | | | |
|---|---|---|---|
| 7,342,412 B2* | 3/2008 | Kim | 326/30 |
| 7,372,293 B2* | 5/2008 | Cox et al. | 326/30 |
| 7,436,204 B2* | 10/2008 | Choi et al. | 326/30 |
| 7,514,955 B2* | 4/2009 | Kim | 326/30 |
| 7,688,671 B2* | 3/2010 | Hosoe et al. | 365/233.1 |
| 7,786,752 B2* | 8/2010 | Oh et al. | 326/30 |
| 7,816,941 B2* | 10/2010 | Kim et al. | 326/30 |
| 8,278,973 B2* | 10/2012 | Kuwahara et al. | 327/112 |
| 8,363,508 B2* | 1/2013 | Fujisawa | 365/233.1 |
| 2008/0100335 A1* | 5/2008 | Choi et al. | 326/30 |
| 2014/0010029 A1* | 1/2014 | Jung et al. | 365/194 |
| 2014/0055162 A1* | 2/2014 | Jung | 326/30 |

FOREIGN PATENT DOCUMENTS

| KR | 100863536 B1 | 10/2008 |
|---|---|---|
| KR | 1020090131020 A | 12/2009 |

* cited by examiner

*Primary Examiner* — Alexander H Taningco
*Assistant Examiner* — Nelson Correa
(74) *Attorney, Agent, or Firm* — William Park & Associates Ltd.

(57) ABSTRACT

An on-die termination circuit includes: a clock signal generation block configured to output a clock signal in response to a clock enable signal, a termination block configured to perform a termination operation on an input/output pad in response to the clock signal, a first termination control signal, and a second termination control signal, a first termination control block configured to generate the first termination control signal in response to the clock signal and a latency control signal, a second termination control block configured to control a latency of a second command and to generate the second termination control signal in response to the clock signal and the latency control signal, and a clock enable signal generation block configured to generate the clock enable signal in response to the first command, the first termination control signal, and the second command.

22 Claims, 6 Drawing Sheets

ON-DIE TERMINATION CIRCUIT

CROSS-REFERENCES TO RELATED APPLICATION

The present application claims priority under 35 U.S.C. §119(a) to Korean application number 10-2012-0069155, filed on Jun. 27, 2012, in the Korean Intellectual Property Office, which is incorporated herein by reference in its entirety.

BACKGROUND

1. Technical Field

The present invention relates generally to a semiconductor device, and more particularly, to an on-die termination circuit.

2. Related Art

A semiconductor device can include an on-die termination circuit for performing a termination operation on an input/output pad for example, to match the impedance of the terminal thereof to a desired value.

SUMMARY

An on-die termination circuit capable of stably controlling an on-die termination function is described herein.

In an embodiment, an on-die termination circuit can include: a clock signal generation block configured to output a clock signal in response to a clock enable signal; a termination block configured to perform a termination operation on an input/output pad in response to the clock signal, a first termination control signal, and a second termination control signal; a first termination control block configured to control a latency of a first command and to generate the first termination control signal in response to the clock signal and a latency control signal; a second termination control block configured to control a latency of a second command and to generate the second termination control signal in response to the clock signal and the latency control signal; and a clock enable signal generation block configured to generate the clock enable signal in response to the first command, the first termination control signal, and the second command.

In another embodiment, an on-die termination circuit can include: a clock enable signal generation block configured to output a clock enable signal in response to an on-die termination command, a first termination control signal, and a dynamic on-die termination command; a delay-locked loop configured to output a delay-locked clock signal in response to the clock enable signal; a termination block configured to perform a termination operation of controlling the impedance of an input/output pad in response to the delay-locked clock signal, the first termination control signal, and a second termination control signal; a first termination control block configured to generate the first termination control signal in response to the delay-locked clock signal and a latency control signal when the on-die termination command is activated; and a second termination control block configured to generate the second termination control signal in response to the delay-locked clock signal and the latency control signal when the dynamic on-die termination command is activated.

BRIEF DESCRIPTION OF THE DRAWINGS

Features, aspects, and embodiments are described in conjunction with the attached drawings, in which.

DETAILED DESCRIPTION

Hereinafter, an on-die termination circuit according to the present invention will be described below with reference to the accompanying drawings through various embodiments.

Figure 1:
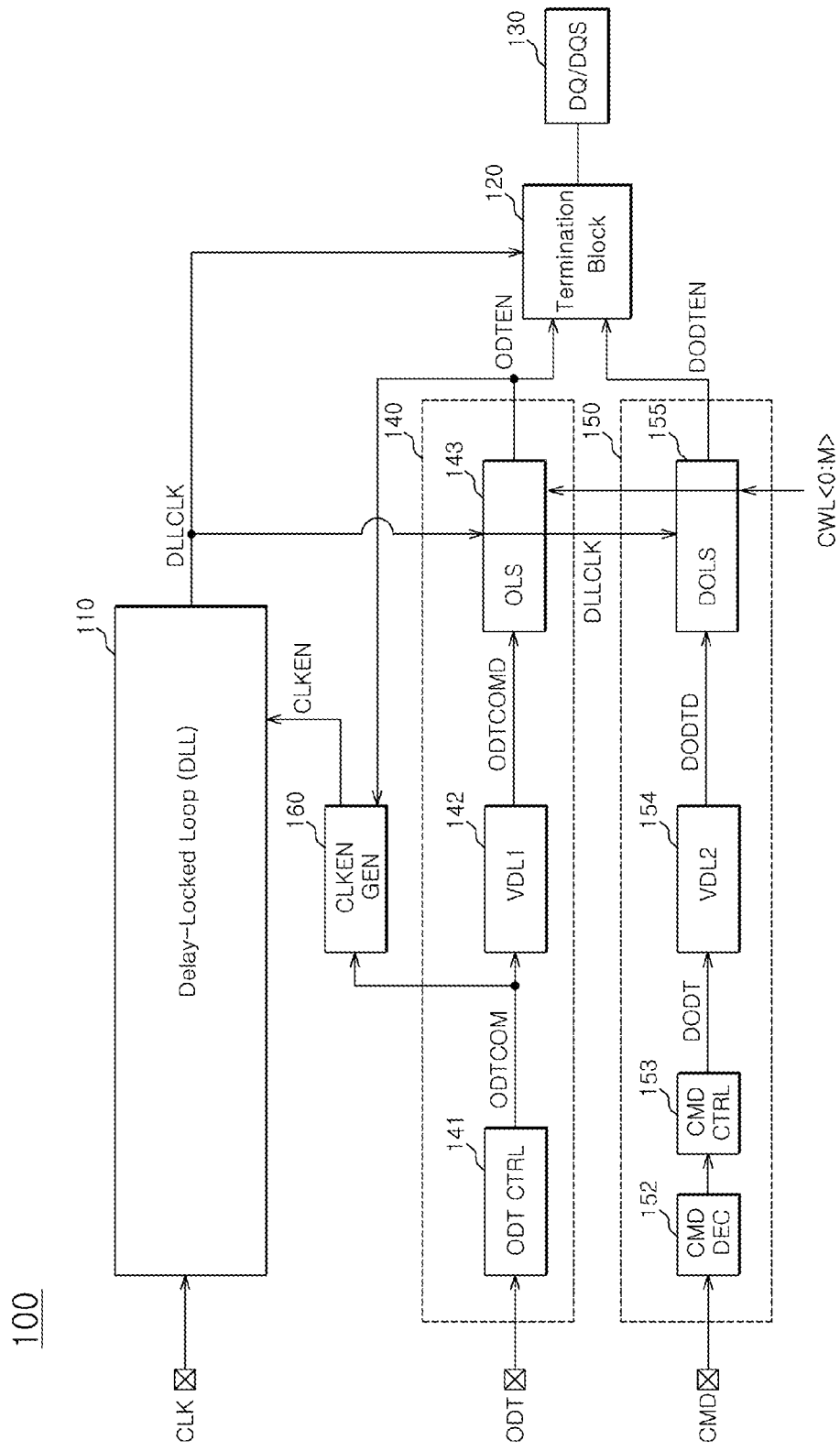
FIG. 1 is a block diagram illustrating an on-die termination circuit 100 according to an embodiment.

As illustrated in FIG. 1, an on-die termination circuit 100 according to an embodiment includes a clock signal generation block, i.e. a delay-locked loop (DLL) 110, a termination block 120, an input/output pad DQ/DQS 130, a first termination control block 140, a second termination control block 150, and a clock enable signal generation block 160.

The delay-locked loop 110 is configured to perform a delay locking operation on an external clock signal CLK, and to generate and output a delay-locked clock signal DLLCLK in response to a clock enable signal CLKEN.

The termination block 120 is configured to perform a termination operation on the input/output pad 130 in response to a first termination control signal ODTEN and a second termination control signal DODTEN.

The termination block 120 can be set to have different impedances under the following circumstances: when the first termination control signal ODTEN is activated, when the second termination control signal DODTEN is activated, and when the two signals ODTEN and DODTEN are all inactivated.

The input/output pad 130 can include a plurality of pads, such as a plurality of DQ and DQS pads.

The first termination control block 140 is configured to control the latency of a first termination command ODTCOM and to generate a first termination control signal ODTEN in response to the delay-locked clock signal DLLCLK and a latency control signal CWL<0:M>.

The second termination control block 150 is configured to control the latency of a second termination command DODT and to generate a second termination control signal DODTEN in response to the delay-locked clock signal DLLCLK and the latency control signal CWL<0:M>.

The clock enable signal generation block 160 is configured to generate a clock enable signal CLKEN in response to the first is termination command ODTCOM and the first termination control signal ODTEN.

The first termination control block 140 includes a timing control block ODT CTRL 141, a variable delay unit VDL1 142, and a latency shift block OLS 143.

The timing control block 141 is configured to control the timing of an external command ODT by a set time and to generate a first termination command ODTCOM.

The variable delay unit 142 is configured to delay the first termination command ODTCOM and to generate a preliminary control signal ODTCOMD.

The delay time of the variable delay unit 142 can be controlled to be substantially similar to that of a variable delay circuit included in the delay-locked loop 110.

The latency shift block 143 is configured to delay the preliminary control signal ODTCOMD by a predetermined latency and to generate a first termination control signal ODTEN in response to the latency control signal CWL<0:M> on the basis of the delay-locked clock signal DLLCLK.

The second termination control block 150 includes a command decoder 152, a timing control block CMD CTRL 153, a variable delay unit VDL2 154, and a latency shift block DOLS 155.

The command decoder 152 is configured to activate an output signal when an external command CMD defines a write operation, that is to say, when the external command CMD is a write is command WT.

The timing control block 153 is configured to control the timing of the output signal of the command decoder 152 by a set time and to generate a second termination command DODT.

The second termination command DODT can be a command to activate an on-die termination function during a write operation.

The variable delay unit 154 is configured to delay the second termination command DODT and to generate a preliminary control signal DODTD.

The delay time of the variable delay unit 154 can be controlled to be substantially similar to that of the variable delay circuit included in the delay-locked loop 110.

The latency shift block DOLS 155 is configured to delay the preliminary control signal DODTD by a predetermined latency and to generate a second termination control signal DODTEN in response to the latency control signal CWL<0:M> on the basis of the delay-locked clock signal DLLCLK.

Figure 2:
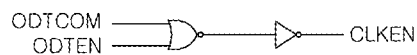
FIG. 2 is a circuit diagram illustrating a clock enable signal generation block CLKEN GEN shown in FIG. 1.

As illustrated in FIG. 2, the clock enable signal generation block 160 is configured to perform an OR operation on the first termination command ODTCOM and the first termination control signal ODTEN and to generate a clock enable signal CLKEN.

Figure 3:
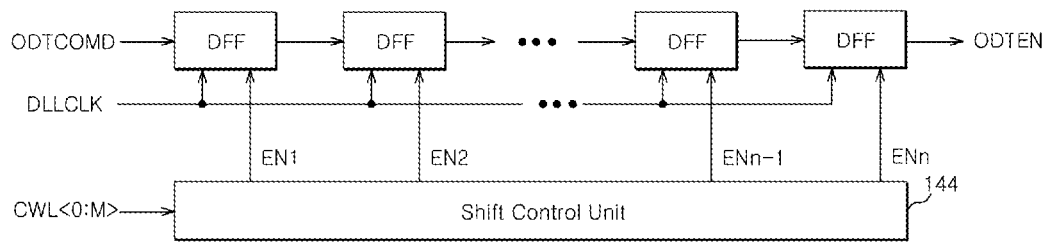
FIG. 3 is a circuit diagram illustrating a latency shift block OLS shown in FIG. 1.

As illustrated in FIG. 3, the latency shift block OLS 143 can include a plurality of flip-flops DFFs and a shift control unit 144.

The shift control unit 144 generates a shift control signal EN<1:n> in response to the latency control signal CWL<0:M>.

The plurality of flip-flops DFFs shift the preliminary control signal ODTCOMD on the basis of the delay-locked clock signal DLLCLK to generate a first termination control signal ODTEN in response to the shift control signal EN<1:n>.

Figure 4:
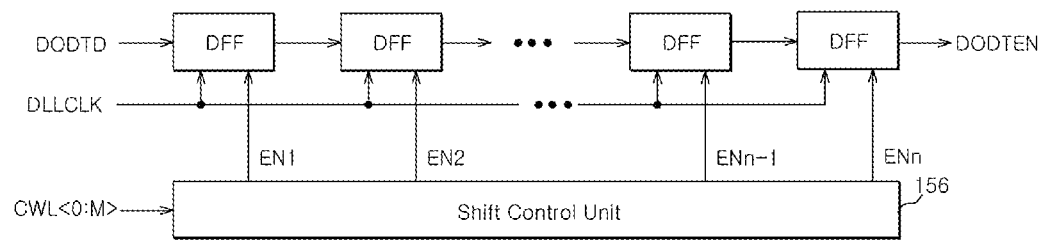
FIG. 4 is a circuit diagram illustrating a latency shift block DOLS shown in FIG. 1.

As illustrated in FIG. 4, the latency shift block DOLS 155 can include a plurality of flip-flops DFFs and a shift control unit 156.

The shift control unit 156 generates a shift control signal EN<1:n> in response to the latency control signal CWL<0:M>.

The plurality of flip-flops DFFs shift the preliminary control signal DODTD on the basis of the delay-locked clock signal DLLCLK to generate a second termination control signal DODTEN in response to the shift control signal EN<1:n>.

Figure 5:
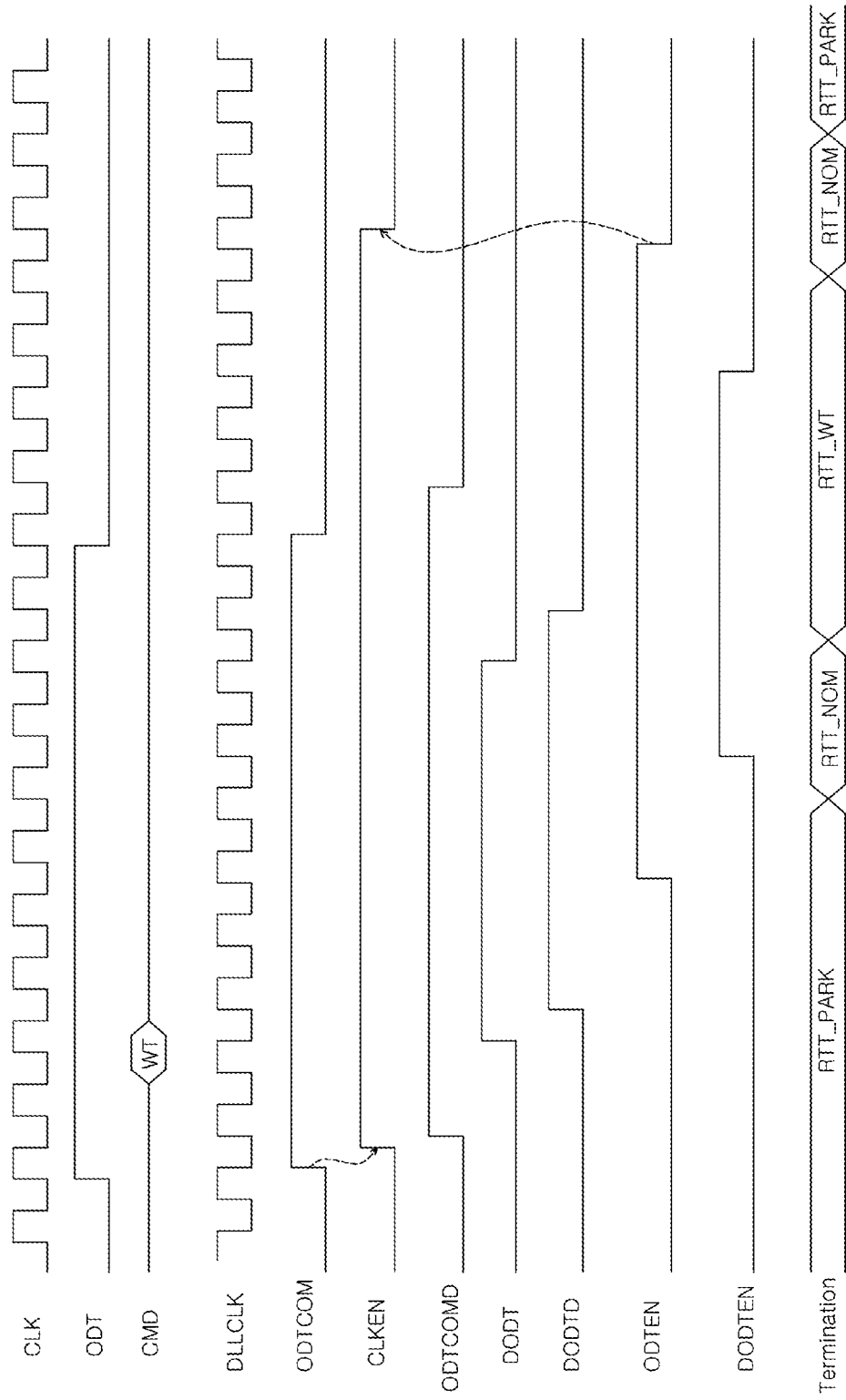
FIG. 5 is a timing diagram illustrating the on-die termination operation of the on-die termination circuit according to an embodiment.

The on-die termination operation of the aforementioned on-die termination circuit 100 according to an embodiment will be described with reference to FIG. 5.

First, a first termination command ODTCOM and a second termination command DODT are generated due to an external command ODT and an external command CMD, respectively.

An example where the external command CMD is a write command WT and the external command ODT is an on-die termination command is provided.

The second termination command DODT is a command for performing a dynamic on-die termination function which is performed during a write operation.

Therefore, as the external command ODT is activated, the is first termination control signal ODTEN is generated on the basis of a delay-locked clock signal DLLCLK.

As the first termination command ODTCOM is generated, a clock enable signal CLKEN is activated.

Subsequently, a latency shift of a preliminary control signal ODTCOMD is performed, so that a first termination control signal ODTEN is activated.

As the first termination control signal ODTEN is inactivated, the clock enable signal CLKEN is inactivated.

In an activated section of the clock enable signal CLKEN, a second termination command DODT is generated according to an external command CMD, i.e. a write command WT.

Subsequently, a latency shift of a preliminary control signal DODTD is performed, and thus a second termination control signal DODTEN is activated.

Within a section in which the clock enable signal CLKEN is activated, the termination block 120 can receive a delay-locked clock signal DLLCLK and perform a termination operation on the input/output pad 130.

The termination block 120 performs a termination operation while controlling the impedance of the input/output pad 130 to have different values depending on the following circumstances: when the external command ODT, i.e. an on-die termination command, is inactivated, or equivalently, when the first termination control signal ODTEN is inactivated (On-Die Termination Off)), when the external is command ODT is activated and the external command CMD, i.e. a write command WT, is inactivated, or equivalently, when the first termination control signal ODTEN is activated and the second termination control signal DODTEN is inactivated (Normal On-Die Termination), and when the external command ODT and external command CMD are all activated, or equivalently, when the first termination control signal ODTEN and the second termination control signal DODTEN are activated (Dynamic On-Die Termination).

In case of on-die termination off, the termination block 120 controls the impedance of the input/output pad 130 to a first termination impedance RTT_PARK.

In case of normal on-die termination, the termination block 120 controls the impedance of the input/output pad 130 to a second termination impedance RTT_NOM.

In case of dynamic on-die termination, the termination block 120 controls the impedance of the input/output pad 130 to a third termination impedance RTT_WR.

Hereinafter, another embodiment will be described in more detail with reference to the accompanying drawings.

Figure 6:
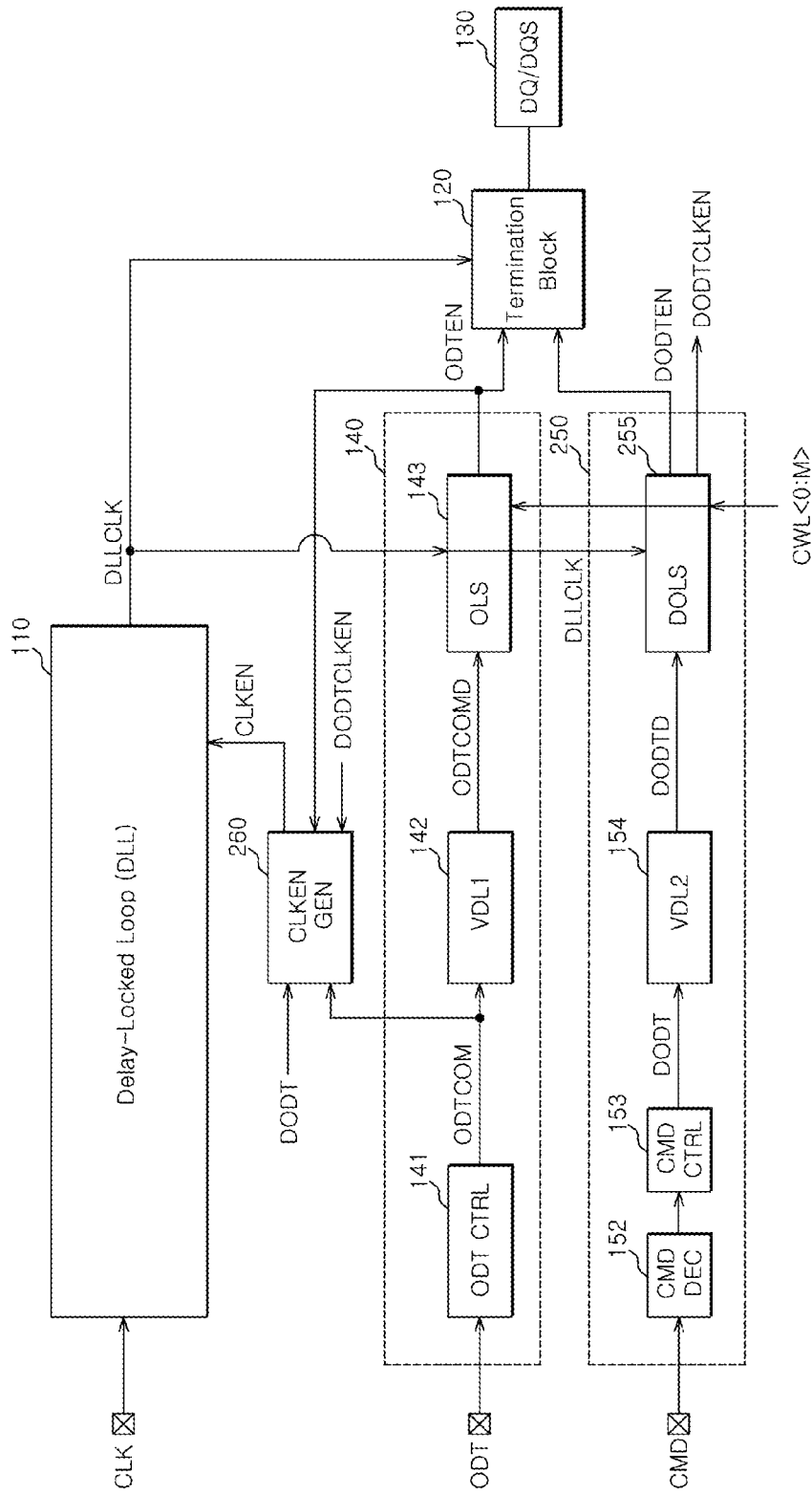
FIG. 6 is a block diagram illustrating an on-die termination circuit 200 according to another embodiment.

As illustrated in FIG. 6, an on-die termination circuit 200 according to another embodiment includes a clock signal generation block, i.e. a delay-locked loop (DLL) 110, a termination block 120, an input/output pad DQ/DQS 130, a first termination control block 140, a second termination control block 250, and a clock enable signal generation block 260.

The delay-locked loop 110 is configured to perform a delay locking operation on an external clock signal CLK, and to generate and output a delay-locked clock signal DLLCLK in response to a clock enable signal CLKEN.

The termination block 120 is configured to perform a termination operation on the input/output pad 130 in response to a first termination control signal ODTEN and a second termination control signal DODTEN.

The termination block 120 can be set to have different impedances under the following circumstances: when the first termination control signal ODTEN is activated, when the second termination control signal DODTEN is activated, and when the two signals ODTEN and DODTEN are all inactivated.

The input/output pad 130 can include a plurality of pads, such as a plurality of DQ and DQS pads.

The first termination control block 140 is configured to control the latency of a first termination command ODTCOM and to generate a first termination control signal ODTEN in response to the delay-locked clock signal DLLCLK and a latency control signal CWL<0: M>.

The second termination control block 250 is configured to generate a second termination control signal DODTEN in which the latency of a second termination command DODT is controlled in response to the delay-locked clock signal DLLCLK and the latency control signal CWL<0:M>.

In addition, the second termination control block 250 is configured to generate a section signal DODTCLKEN in response to the preliminary control signal DODTD and the second termination control signal DODTEN.

The clock enable signal generation block 260 is configured to generate a clock enable signal CLKEN in response to the first termination command ODTCOM, the first termination control signal ODTEN, the second termination command DODT, and the section signal DODTCLKEN.

The first termination control block 140 includes a timing control block ODT CTRL 141, a variable delay unit VDL1 142, and a latency shift block OLS 143.

The timing control block 141 is configured to control the timing of an external command ODT by a set time and to generate a first termination command ODTCOM.

The variable delay unit 142 is configured to delay the first termination command ODTCOM and to generate a preliminary control signal ODTCOMD.

The delay time of the variable delay unit 142 can be controlled to be substantially similar to that of a variable delay circuit included in the delay-locked loop 110.

The latency shift block 143 is configured to delay the preliminary control signal ODTCOMD by a predetermined latency and to generate a first termination control signal ODTEN in response to the latency control signal CWL<0:M> on the basis of the delay-locked clock signal DLLCLK.

The second termination control block 250 includes a command decoder 152, a timing control block CMD CTRL 153, a variable delay unit VDL2 154, and a latency shift block DOLS 255.

The command decoder 152 is configured to activate an output signal when an external command CMD defines a write operation, that is to say, when the external command CMD is a write command WT.

The timing control block 153 is configured to control the timing of the output signal of the command decoder 152 by a set time and to generate a second termination command DODT.

The second termination command DODT can be a command to activate an on-die termination function during a write operation.

The variable delay unit 154 is configured to delay the second termination command DODT and to generate a preliminary control signal DODTD.

The delay time of the variable delay unit 154 can be controlled to be substantially similar to that of the variable delay circuit included in the delay-locked loop 110.

The latency shift block DOLS 255 is configured to delay the preliminary control signal DODTD by a predetermined latency and to generate a second termination control signal DODTEN in response to the latency control signal CWL<0: M> on the basis of the delay-locked clock signal DLLCLK.

The latency shift block DOLS 255 is configured to generate a section signal DODTCLKEN in response to the preliminary control signal DODTD and the second termination control signal DODTEN.

Figure 7:
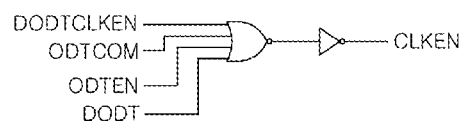
FIG. 7 is a circuit diagram illustrating a clock enable signal generation unit CLKEN GEN shown in FIG. 6.

As illustrated in FIG. 7, the clock enable signal generation block 260 is configured to perform an OR operation on the first termination command ODTCOM, the first termination control signal ODTEN, the second termination command DODT, and the section signal DODTCLKEN, and to generate a clock enable signal CLKEN.

Figure 8:
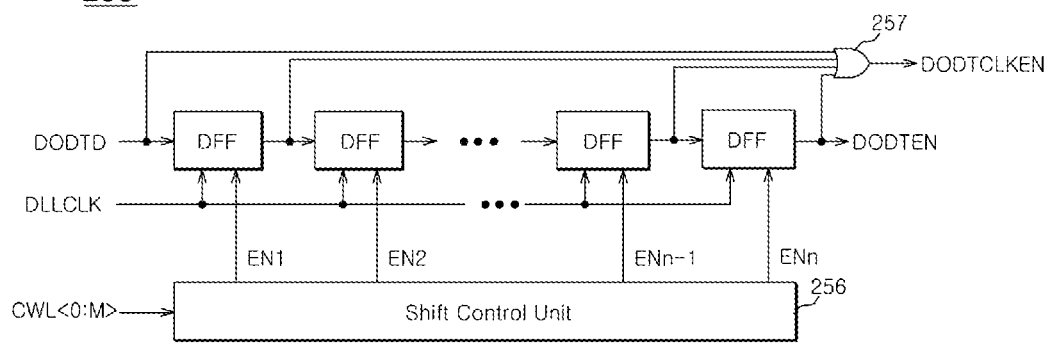
FIG. 8 is a circuit diagram illustrating a second latency shift block DOLS shown in FIG. 6.

As illustrated in FIG. 8, the latency shift block DOLS 255 can include a plurality of flip-flops DFFs, a shift control unit 256, and a logic gate 257.

The shift control unit 256 generates a shift control signal EN<1:n> in response to the latency control signal CWL<0: M>.

The plurality of flip-flops DFFs shift the preliminary control signal DODTD on the basis of the delay-locked clock signal DLLCLK to generate a second termination control signal DODTEN in response to the shift control signal EN<1: n>.

The logic gate 257 performs an OR operation on the preliminary control signal DODTD and the output signals of the plurality of flip-flops DFFs, to generate a section signal DODTCLKEN.

Figure 9:
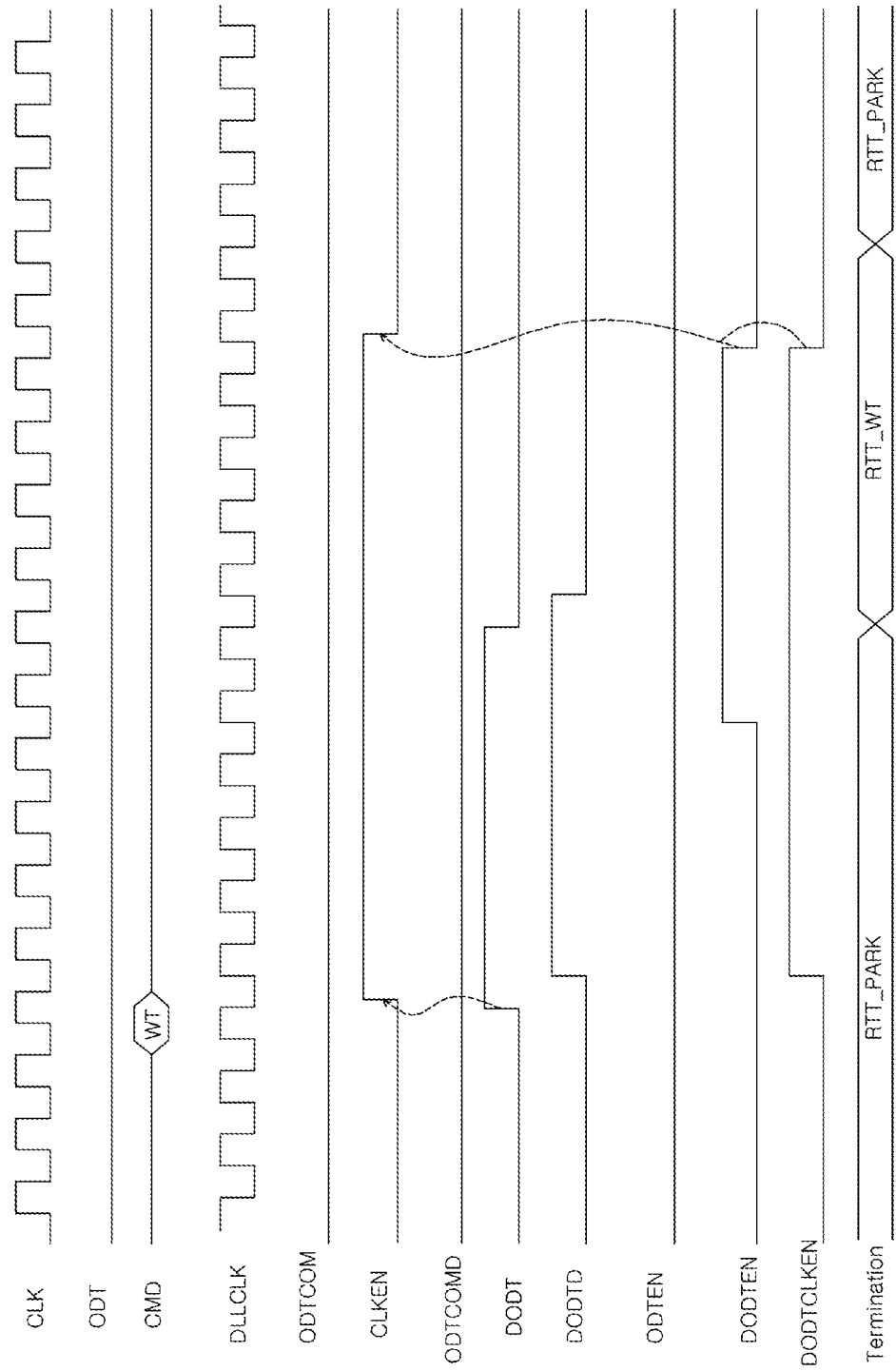
FIG. 9 is a timing diagram illustrating the on-die termination operation of the on-die termination circuit according to an embodiment.

The on-die termination operation of the aforementioned on-die termination circuit 200 according to an embodiment will be described with reference to FIG. 9.

First, a first termination command ODTCOM and a second termination command DODT are generated due to an external command ODT and an external command CMD, respectively.

An example where the external command CMD is a write command WT and the external command ODT is an on-die termination command is provided.

The second termination command DODT is a command for performing a dynamic on-die termination function which is performed during a write operation.

Although the external command ODT, i.e. an on-die termination command, is not activated, a dynamic on-die termination function can be performed when the external command CMD, i.e. a write command WT, is input.

In other words, in a state in which the on-die termination command is not activated, when the external command CMD, i.e. a write command WT, is input, the second termination command DODT is generated.

Subsequently, a latency shift of a preliminary control signal DODTD is performed, and thus the second termination control signal DODTEN is activated.

Next, as the second termination control signal DODTEN is inactivated, the clock enable signal CLKEN is inactivated.

As described above, although an on-die termination command is not activated, the clock enable signal CLKEN is activated as the external command CMD, i.e. a write command WT, is input.

Accordingly, the termination block 120 can receive a delay-locked clock signal DLLCLK and perform a termination operation on the input/output pad 130.

The termination block 120 can perform a termination operation while controlling the impedance of the input/output pad 130 to have different values depending on the following circumstances: when the external command ODT, i.e. an on-die termination command, and the external command CMD, i.e. a write command WT, are all inactivated, or equivalently, when the first termination control signal ODTEN and the second termination control signal DODTEN are all inactivated (On-Die Termination Off), when the external command ODT is activated and the external command CMD, i.e. a write command WT, is inactivated, or equivalently, when the first termination control signal ODTEN is activated and the second termination control signal DODTEN is inactivated (Normal On-Die Termination), and when the external command CMD is activated, or equivalently, when the second termination control signal DODTEN is activated (Dynamic On-Die Termination).

In case of on-die termination off, the termination block 120 controls the impedance of the input/output pad 130 to a first termination impedance RTT_PARK.

In case of normal on-die termination, the termination block 120 controls the impedance of the input/output pad 130 to a second termination impedance RTT_NOM.

In case of dynamic on-die termination, the termination block 120 controls the impedance of the input/output pad 130 to a third termination impedance RTT_WR.

According to the embodiments of the present invention, is even when an on-die termination command is not activated, a dynamic on-die termination function can operate, and thus it is possible to stably control the impedance of an input/output pad to a desired value.

While certain embodiments have been described above, it will be understood to those skilled in the art that the embodiments described are by way of example only. Accordingly, the device described herein should not be limited based on the described embodiments. Rather, the device described herein should only be limited in light of the claims that follow when taken in conjunction with the above description and accompanying drawings.

What is claimed is:

1. An on-die termination circuit comprising:
    a clock signal generation block configured to output a clock signal during an activation period of a clock enable signal;
    a termination block configured to perform a termination operation on an input/output pad in response to the clock signal, a first termination control signal, and a second termination control signal;
    a first termination control block configured to control a latency of a first command and to generate the first termination control signal in response to the clock signal and a latency control signal;
    a second termination control block configured to control a latency of a second command and to generate the second termination control signal in response to the clock signal and the latency control signal; and
    a clock enable signal generation block configured to activate the clock enable signal when any one of the first command and the second command is activated.

2. The on-die termination circuit according to claim 1, wherein the first command corresponds to an on-die termination command.

3. The on-die termination circuit according to claim 1, wherein the second command corresponds to a write command.

4. The on-die termination circuit according to claim 1, wherein the clock signal generation block corresponds to a delay-locked loop.

5. The on-die termination circuit according to claim 1, wherein the first termination control block comprises:
    a timing control block configured to control the timing of an external command by a set time and to generate the first command;
    a variable delay unit configured to delay the first command and to generate a preliminary control signal; and
    a first latency shift block configured to delay the preliminary control signal by a predetermined latency in response to the latency control signal on the basis of the delay-locked clock signal, and to generate the first termination control signal.

6. The on-die termination circuit according to claim 5, wherein the first latency shift block comprises:
    a shift control unit configured to generate a shift control signal in response to the latency control signal; and
    a plurality of flip-flops configured to shift the preliminary control signal on the basis of the delay-locked clock signal in response to the shift control signal, and to generate the first termination control signal.

7. The on-die termination circuit according to claim 1, wherein the second termination control block comprises:
    a command decoder configured to activate an output signal when an external command defines a write operation;
    a timing control block configured to control the timing of the output signal of the command decoder by a set time and to generate the second command;
    a variable delay unit configured to delay the second command and to generate a preliminary control signal; and
    a second latency shift block configured to delay the preliminary control signal by a predetermined latency in response to the latency control signal on the basis of the delay-locked clock signal, and to generate the second termination control signal.

8. The on-die termination circuit according to claim 7, wherein the second latency shift block comprises:
    a shift control unit configured to generate a shift control signal in response to the latency control signal; and
    a plurality of flip-flops configured to shift the preliminary control signal on the basis of the delay-locked clock signal in response to the shift control signal, and to generate the second termination control signal.

9. The on-die termination circuit according to claim 8, wherein the clock enable signal generation block is configured to generate the clock enable signal in response to the first command, the first termination control signal, the second command, and a section signal.

10. The on-die termination circuit according to claim 9, wherein the second latency shift block is configured to generate the section signal in response to the preliminary control signal and the second termination control signal.

11. The on-die termination circuit according to claim 10, wherein the second latency shift block comprises:
    a shift control unit configured to generate a shift control signal in response to the latency control signal;
    a plurality of flip-flops configured to shift the preliminary control signal on the basis of the delay-locked clock signal in response to the shift control signal, and to generate the second termination control signal; and a logic gate configured to perform an OR operation on the preliminary control signal and the output signals of the plurality of flip-flops, and to generate the section signal.

12. The on-die termination circuit according to claim 1, wherein the clock enable signal generation block is configured to deactivate the clock enable signal when the first termination control signal and the second termination control signal are deactivated.

13. An on-die termination circuit comprising:
a clock enable signal generation block configured to activate a clock enable signal when any one of an on-die termination command and a dynamic on-die termination command is activated;
a delay-locked loop configured to output a delay-locked clock signal during an activation period of the clock enable signal;
a termination block configured to perform a termination operation of controlling the impedance of an input/output pad in response to the delay-locked clock signal, a first termination control signal, and a second termination control signal;
a first termination control block configured to generate the first termination control signal in response to the delay-locked clock signal and a latency control signal when the on-die termination command is activated; and
a second termination control block configured to generate the second termination control signal in response to the delay-locked clock signal and the latency control signal when the dynamic on-die termination command is activated.

14. The on-die termination circuit according to claim 13, wherein the dynamic on-die termination command corresponds to a command to control the impedance of the input/output pad during a write operation section.

15. The on-die termination circuit according to claim 13, wherein the clock enable signal generation block is configured to activate the clock enable signal when one or both of the on-die termination command and the dynamic on-die termination command are activated.

16. The on-die termination circuit according to claim 13, wherein the on-die termination circuit is configured to activate the clock enable signal when the dynamic on-die termination command is activated in a state in which the on-die termination command is inactivated.

17. The on-die termination circuit according to claim 13, wherein the first termination control block comprises:
a timing control block configured to control the timing of the on-die termination command by a set time;
a variable delay unit configured to delay an output signal of the timing control block and to generate a preliminary control signal; and a first latency shift block configured to delay the preliminary control signal by a predetermined latency in response to the latency control signal on the basis of the delay-locked clock signal, and to generate the first termination control signal.

18. The on-die termination circuit according to claim 13, wherein the second termination control block comprises:
a command decoder configured to decode the dynamic on-die termination command;
a timing control block configured to control the timing of the output signal of the command decoder by a set time;
a variable delay unit configured to delay an output signal of the timing control block and to generate a preliminary control signal; and
a second latency shift block configured to delay the preliminary control signal by a predetermined latency in response to the latency control signal on the basis of the delay-locked clock signal, and to generate the second termination control signal.

19. The on-die termination circuit according to claim 18, wherein the clock enable signal generation block is configured to generate the clock enable signal in response to the on-die termination command, the first termination control signal, the dynamic on-die termination command, and a section signal.

20. The on-die termination circuit according to claim 19, wherein the second latency shift block is configured to generate the section signal in response to the preliminary control signal and the second termination control signal.

21. The on-die termination circuit according to claim 20, wherein the second latency shift block comprises:
a shift control unit configured to generate a shift control signal in response to the latency control signal;
a plurality of flip-flops configured to shift the preliminary control signal on the basis of the delay-locked clock signal in response to the shift control signal, and to generate the second termination control signal; and
a logic gate configured to perform an OR operation on the preliminary control signal and the output signals of the plurality of flip-flops, and to generate the section signal.

22. The on-die termination circuit according to claim 13, wherein the clock enable signal generation block is configured to deactivate the clock enable signal when the first termination control signal and the second termination control signal are deactivated.

* * * * *